(12) United States Patent
Komura

(10) Patent No.: US 6,520,109 B2
(45) Date of Patent: Feb. 18, 2003

(54) HEAT INSULATION ARRANGEMENT OF INDICATING INSTRUMENT

(75) Inventor: Takashi Komura, Toyota (JP)

(73) Assignee: Denso Corporation, Kariya (JP)

( * ) Notice: Subject to any disclaimer, the term of this patent is extended or adjusted under 35 U.S.C. 154(b) by 17 days.

(21) Appl. No.: 09/816,143

(22) Filed: Mar. 26, 2001

(65) Prior Publication Data

US 2001/0025596 A1 Oct. 4, 2001

(30) Foreign Application Priority Data

Mar. 30, 2000 (JP) .......................... 2000-97906

(51) Int. Cl.7 ............................ G01D 11/24; G01R 12/30
(52) U.S. Cl. ...................... 116/288; 361/772; 116/286; 116/305
(58) Field of Search ................. 116/62.1, 284, 116/285, 286, 287, 288, 305; 362/29, 30, DIG. 800; 361/772, 773, 774

(56) References Cited

U.S. PATENT DOCUMENTS

| | | | | |
|---|---|---|---|---|
| RE31,073 E | * | 11/1982 | Fehrenbacher | 368/134 |
| 4,785,434 A | * | 11/1988 | Shoji et al. | 368/185 |
| 5,142,453 A | * | 8/1992 | Ohta et al. | 362/29 |
| 5,143,434 A | * | 9/1992 | Ohta et al. | 362/29 |
| 5,291,851 A | * | 3/1994 | Muramatsu | 116/286 |
| 5,531,181 A | * | 7/1996 | Cookingham | 116/288 |
| 5,546,888 A | * | 8/1996 | Skiver et al. | 116/286 |
| 5,612,855 A | * | 3/1997 | Heeb et al. | 361/773 |
| 5,690,049 A | * | 11/1997 | Marshall et al. | 116/284 |
| 5,839,810 A | * | 11/1998 | Hersel et al. | 362/29 |
| 5,857,767 A | * | 1/1999 | Hochstein | 362/294 |
| 5,953,213 A | * | 9/1999 | Napierala | 361/760 |
| 6,335,548 B1 | * | 1/2002 | Roberts et al. | 250/239 |

* cited by examiner

Primary Examiner—Diego Gutierrez
Assistant Examiner—R. Alexander Smith
(74) Attorney, Agent, or Firm—Harness, Dickey & Pierce, PLC

(57) ABSTRACT

An indicating instrument includes a transparent dial plate, a printed circuit board disposed behind the dial plate, a drive unit disposed behind the printed circuit board having a plurality of lead wires soldered to the printed circuit board, a light conductive luminous pointer and a light emitting diode disposed on the printed circuit board near a rotary shaft so that the pointer can receive light emitted from the light emitting diode. Each end of the plurality of lead wires is disposed on the printed circuit board at a distance from the light emitting diode sufficient to insulate the light emitting diode from heat of soldering the plurality of lead wires to the circuit board.

11 Claims, 2 Drawing Sheets

HEAT INSULATION ARRANGEMENT OF INDICATING INSTRUMENT

CROSS REFERENCE TO RELATED APPLICATION

The present application is based on and claims priority from Japanese Patent Application 2000-97906 filed Mar. 30, 2000, the contents of which are incorporated herein by reference.

BACKGROUND OF THE INVENTION

1. Field of the Invention

The present invention relates to an indicating instrument for various devices, and particularly, a vehicular indicating instrument having a luminous pointer.

2. Description of the Related Art

In a vehicular indicating instrument having a luminous pointer, a main portion of a drive unit is disposed behind a dial plate, and a rotary shaft extends outward from a through hole of the dial plate to carry a pointer at the end thereof. A pointer-illumination light emitting diode is disposed near the rotary shaft and the through hole behind the dial plate. A dial-plate-illumination light emitting diode may be also disposed near the rotary shaft behind the dial plate. Generally, such light emitting diodes are not sufficiently resistant to heat of soldering and a heat shock, if repeated.

If a step motor, which usually employs a resinous speed reduction gear train, is installed in the drive unit, it should be taken into account that such a step motor may not be resistant to the heat of soldering or heat shocks very much.

SUMMARY OF THE INVENTION

A main object of the invention is to provide an improved and reliable indicating instrument that includes a light emitting diode and other heat-sensitive parts.

According to a main feature of the invention in an indicating instrument that includes a transparent dial plate, a printed circuit board disposed behind the dial plate, a drive unit and a light conductive luminous pointer and a light emitting diode, a plurality of lead wires extended from the drive unit is respectively soldered to such distant portions on the printed circuit board from the diode that can insulate the diode from soldering heat.

Although the heat of soldering the light emitting diode to the circuit board is high and heat stresses are applied to the light emitting diode, the light emitting diode is not damaged because such heat and stress are the first heat to be applied to the diode and not applied thereto any more.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Figure 1:
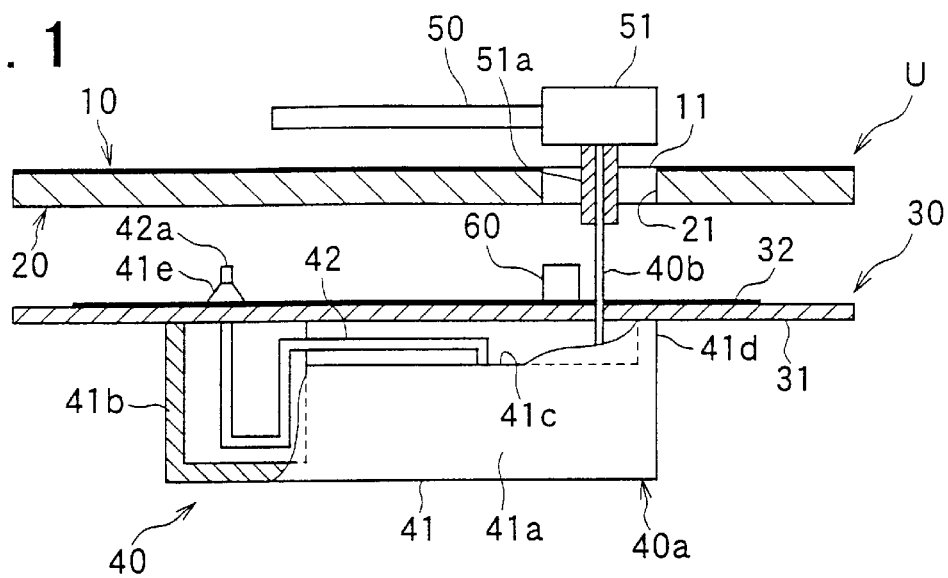
FIG. 1 is a fragmentary cross-sectional side view illustrating a main portion of an indicating instrument according to a first embodiment of the invention.
Figure 2:
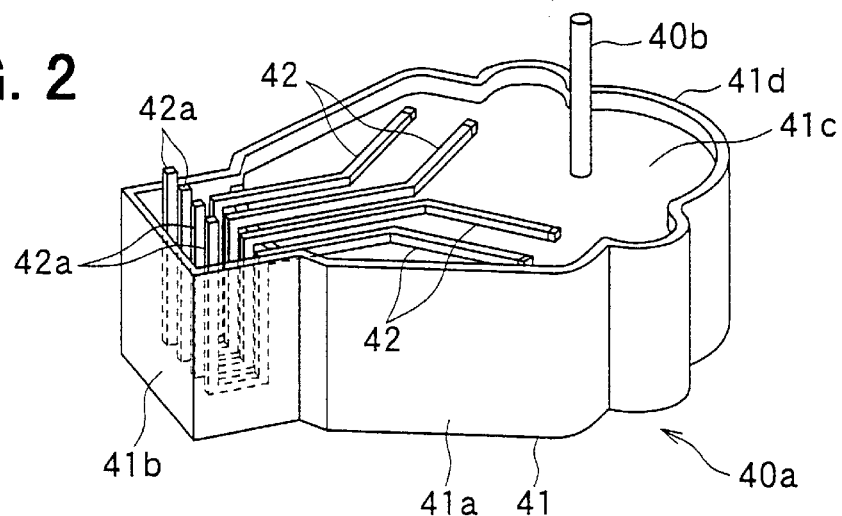
FIG. 2 is a perspective view of the indicating instrument according to the first embodiment.

An indicating instrument according to a first embodiment of the invention is described with reference to FIGS. 1 and 2. The indicating instrument according to the first embodiment is installed into the passenger compartment of a car. The indicating instrument is generally comprised of a plurality of dial plate units U of substantially the same similar structure. A dial plate unit U is comprised of a dial plate 10, a light conducting plate 20, a printed circuit board 30, a drive unit 40, a luminous pointer 50 and light emitting diode 60.

The light conducting plate 20 receives light emitted from a light tube (not shown) disposed at a side edge thereof and conducts the light to the dial plate 10 to let the light penetrate dial plate 10.

The printed circuit board 30 has a printed circuit 32 of thin copper or aluminum films printed on a hard insulation board 31. The printed circuit board 30 is disposed on the front surface of a drive control section 40a of the drive unit 40 behind the light conducting plate 20. The printed circuit board 30 may be a flexible circuit board that has an insulation board made of polyester or polyimide solid.

The drive control section 40a is comprised of a resinous casing 41, which includes a case member 41a, a terminal box 41b and a common outer wall. The terminal box 41b is fixed to an outer wall of the case member 41a. In addition to the drive control section 40a, the driving unit 40 also includes a rotary shaft 40b. The case member 41a has a ceiling 41c and accommodates a step motor and a speed reduction gear train under the ceiling 41c. The common outer wall extends upward from the ceiling 41c and forms an enclosure wall 41d.

The step motor has a plurality of beam-like lead wires 42. Each lead wire 42 extends from the inside of the case member 41a into the terminal box 41b along the ceiling 41c inside the enclosure wall 41d. Each lead wire 42 has a U-shaped portion that is accommodated in the terminal box 41b and a terminal 42a at the end of the portion thereof. Each lead wire 42 also extends radially outward from the case member and upward from the terminal box 41b through the circuit board 30. The terminal 42a is soldered to a portion 41e around a land hall of a printed circuit 32 of the circuit board 30 that is located remote from the rotary shaft 40b. The ceiling 41d of the casing 41 is fixed to the back of the circuit board 30.

The beam-like lead wires 42 may be disposed in close contact with the back of the circuit board 30 so that the heat generated while the light emitting diode 60 is powered can be dissipated through the lead wires 42.

The rotary shaft 40b extends from ceiling 41c of the casing 41 through a through hole 21 of the light conducting plate 20 and a through hole 11 of the dial plate 10. The rotary shaft 40b is connected to an output side of the speed reduction gear train disposed in the case member 41a. The through hole 11 is formed at the center of dial plate 10, or the center of an arc-shaped scale pattern.

The luminous pointer 50 has a base portion 51, which has a boss portion 51a carried by the end of the rotary shaft 40b. The luminous pointer 50 becomes luminous when it receives light of the light emitting diode 60 at the back of the base portion 51 through the through holes 21 and 11.

The light emitting diode 60 is a surface mounting type diode and fixed to a printed circuit 32 of the front surface of the circuit board 30 around the rotary shaft 40b so that it can face the back of the base portion 51 through the through holes 21 and 11. The light emitting diode 60 is powered from a DC electric source via the circuit board 30 to emit light and project the light through the through holes 21 and 11 to the base portion 51 of the pointer 50. The light emitting diode 60 that is soldered to another portion of the circuit board 30 is about 10 mm distant from the terminal 42a of the lead wire 42 that is soldered to a portion of the circuit board 30. Therefore, heat of the soldering the terminal 42a and the circuit board 30 does not damage the light emitting diode 60.

In soldering, the light emitting diode 60 and other electric parts except the lead wires 42a are soldered by a reflow or a flow soldering process to corresponding portions of the circuits 32 of the circuit board 30. Even if the heat of such soldering is high and heat stresses are applied to the light emitting diode that is soldered to the circuit board 30 near the rotary shaft 40b, the light emitting diode 60 is not damaged because such heat and stress are the first heat to be applied to the diode 60.

After the soldering heat has dissipated, the casing 41 is fixed to the back of the circuit board 30 at the enclosure wall 41d, and the terminal 42a of the lead wires 42 are respectively inserted into land holes of the circuit board 30. Thereafter, the terminals 42a are respectively soldered to the corresponding portions 41e of the printed circuit 32. Because the light emitting diode 60 is about 10 mm distant from the terminals 42a, the diode 60 is insulated from the soldering heat and the heat shocks. Since the casing 41 is fixed to the circuit board 30 after the high temperature due to the reflow or flow process has lowered, the resinous speed reduction gear train, which may not be heat resistant, can be protected from such high temperature. The resinous speed reduction gear train is also disposed remote from the terminal 42a or soldered portion 41e of the circuit board 30. Therefore, the gear train is not damaged by the heat caused while the lead wires 42 are soldered to the circuit board 30.

As a variation, the drive unit that includes the step motor can be substituted by a well-known cross-coil type drive unit.

Figure 3:
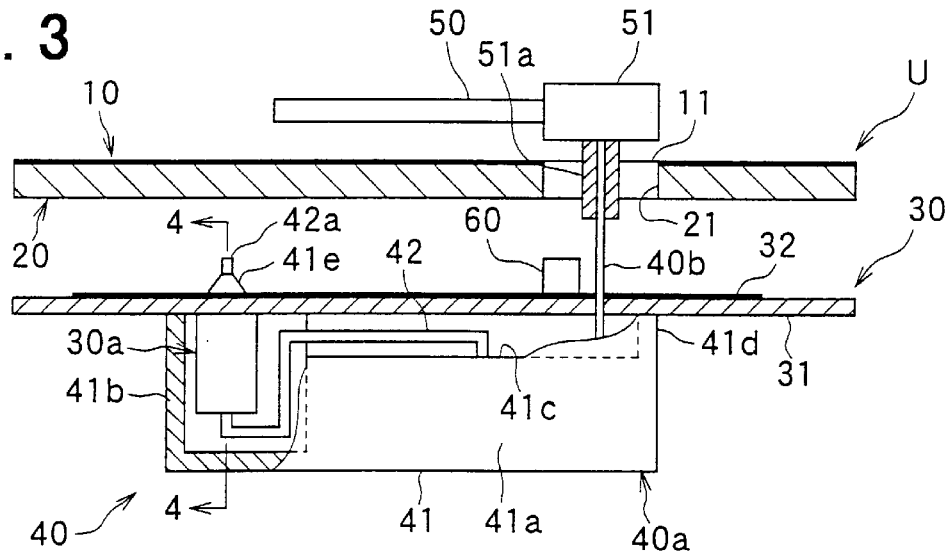
FIG. 3 is a fragmentary cross-sectional side view illustrating a main portion of an indicating instrument according to a second embodiment of the invention.
Figure 4:
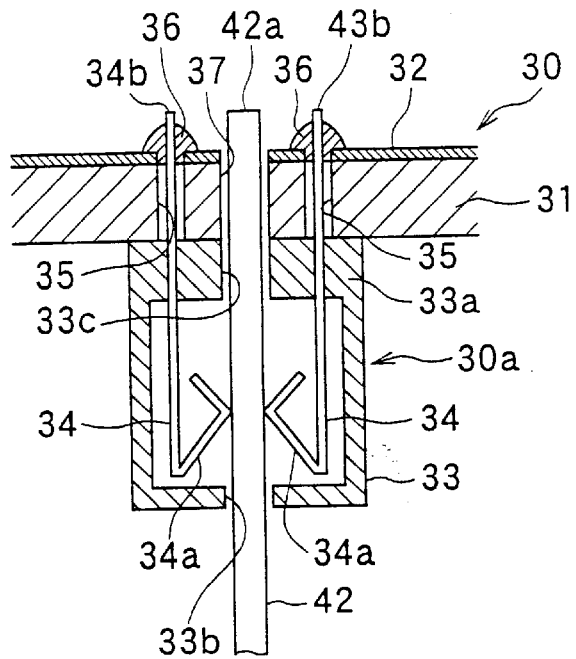
FIG. 4 is a cross-sectional view of a connector of the indicating instrument illustrated in FIG. 3.

An indicating instrument according to a second embodiment of the invention is described with FIGS. 3 and 4. In the meantime, the same reference numeral in the following drawings corresponds to the same part or portion as the first embodiment.

As many connectors 30a as the lead wires 42 of circuit board are fixed to the back of the circuit board 30 and disposed inside the terminal box 40b to respectively correspond to the lead wires 42. Each connector 30a has a cylindrical casing 33, which has a ceiling 33a fixed to the back of the circuit board 30 so as to receive corresponding one of the lead wires 42 and a pair of contact members 34 generally extending in parallel with the lead wire 42. Each contact member 34 has an L-shaped contact edge 34a that elastically presses against a middle portion of the outer periphery of the corresponding lead wire 42. Each contact member 34 has an upper end 34b that is inserted into one of land holes 35 of the circuit board 30. Each land hole 35 is formed from a through hole of the insulation board 31 and a hole of the printed circuit 32. The upper ends 34b are soldered to the land holes 35.

Each terminal 42a of the step motor is inserted into one of casings 33 through a through hole 33b of the bottom thereof, between the pair of contact edges 34a and through a through hole 33c of the ceiling 33a and is extended outward from a through hole 37 of the circuit board 30. No portion of the printed circuit 32 exists around the through hole 37.

In assembling, each connector 30a is fixed to the back of the circuit board 30 at the ceiling 33a, and the upper end 34b of each contact member 34 is inserted into one of the land holes 35. Thereafter, the terminal members 30a of the connectors 30a, the light emitting diode 60 and other electric parts are respectively soldered to the printed circuit 32 of the circuit board 30 by the reflow or flow soldering process. The upper ends 34a of the pairs of contact members 34 are respectively soldered to circuit portions 36 of the corresponding land holes 35, as shown in FIG. 4. Even if the heat of such soldering is high and heat stresses are applied to the light emitting diode 60, the light emitting diode 60 is not damaged because such heat and stress are the first heat to be applied to the diode 60 and not applied thereto any more.

After the soldering heat has dissipated, the casing 41 is fixed to the back of the circuit board 30 at the enclosure wall 41d, and the connectors 30a are accommodated in the terminal box 41b. At the same time, each terminal 42a is inserted into the through holes 33a, between the pair of contact members 34a, the through hole 33c of the ceiling and the through hole 37 of the circuit board 30. Because no portion of the printed circuit 32 exists around the through hole 37, the through holes 37 are not blocked by solder chips. Thus, the lead wires 42 are connected via the connectors 30a to the circuit board 30 without soldering.

As a variation of the above indicating instrument, the light emitting diode 60 can be used for illuminating the dial plate 10 instead of the light tube. For this purpose, a light intercepting portion is formed at the inner periphery of the through hole 21 of the light conducting plate 20.

Figure 5:
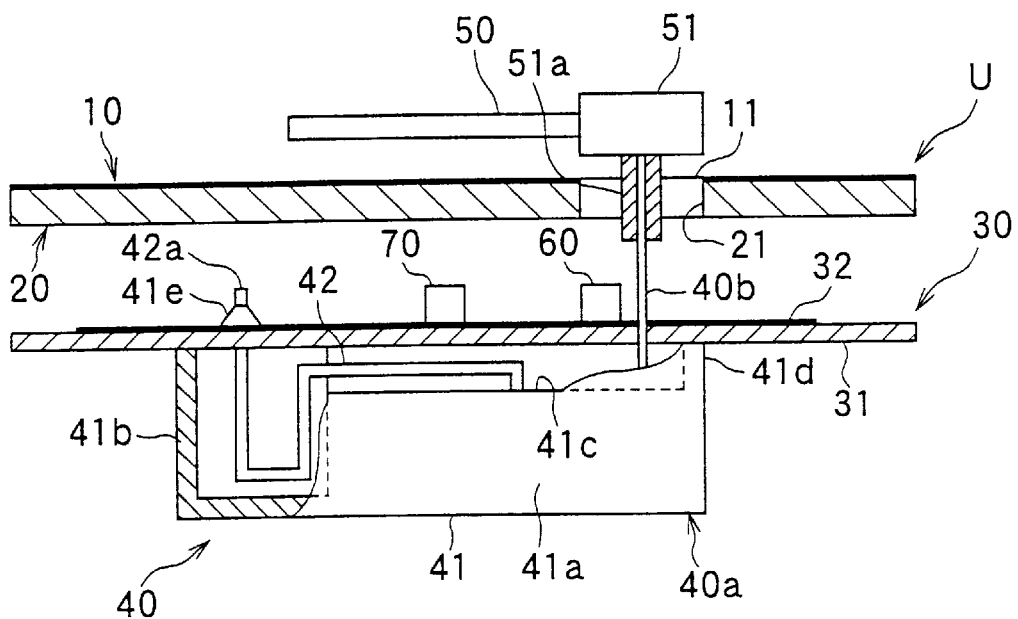
FIG. 5 is a fragmentary cross-sectional side view illustrating a main portion of an indicating instrument according to a third embodiment of the invention.

An indicating instrument according to a third embodiment of the invention is described with reference to FIG. 5.

A plurality of surface mounting-type light emitting diodes 70 is substituted for the light tube of the indicating instrument according to the first embodiment. The plurality of dial-plate illumination light emitting diodes 70 is mounted on the circuit 32 to correspond to the dial plate 10. Each light emitting diode 70 emits light to the dial plate 10 through the light conducting plate 20, so that uniform light as a whole can penetrate the dial plate 10. The plurality of light emitting diodes 70 are disposed at a distance of about 10 mm from the soldered portion 41e of the terminals 42a around the rotary shaft 40b and the light emitting diode 60 for illuminating the pointer 50.

In soldering, the light emitting diodes 60 and 70 and other electric parts except the lead wires 42a are soldered by a reflow or a flow soldering process to corresponding portions of the circuits 32 of the circuit board 30. Even if the heat of such soldering is high and heat stresses are applied to the light emitting diodes 60 and 70, the light emitting diodes 60 and 70 are not damaged because such heat and stress are the first heat to be applied to the diodes 60 and 70.

After the soldering heat has dissipated, the casing 41 is fixed to the back of the circuit board 30, and the terminal 42a of the lead wires 42 are respectively inserted into land holes of the circuit board 30. Thereafter, the terminals 42a are respectively soldered to the corresponding portions 41e of the printed circuit 32. Because the light emitting diodes 60 and 70 are 10 mm or longer distant from the terminals 42a, the diodes 60 and 70 are insulated from the soldering heat and the heat shocks.

As a variation of the indicating instrument according to the third embodiment, the light conducting plate 20 can be omitted. In this variation, the luminous pointer 50 can be disposed behind the dial plate 10.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. An indicating instrument comprising:
    a transparent dial plate;
    a printed circuit board disposed behind said dial plate;
    a drive unit having a drive control section disposed behind said printed circuit board and a rotary shaft extending from said drive control section through said printed circuit board toward the center of said dial plate, said drive control section having a step motor and a plurality of lead wires soldered to said printed circuit board;
    a light conductive luminous pointer having a base portion carried by said rotary shaft to rotate along the surface of said dial plate; and
    a light emitting diode disposed on said printed circuit board near said rotary shaft so that said base portion of said pointer can receive light emitted from said diode, said light emitting diode being soldered to said printed circuit board; wherein
    said printed circuit board has a first portion soldered to said light emitting diode and a second portion separately soldered to said plurality of lead wires disposed at a distance from said light emitting diode;
    said drive control section comprises a case member for accommodating said step motor and a terminal box for accommodating said plurality of lead wires so that said rotary shaft and said plurality of lead wires respectively extend upward from said drive unit at opposite ends of said drive unit, whereby
    each end of said plurality of lead wires is disposed on said printed circuit board at the distance from said light emitting diode to insulate said light emitting diode from heat of soldering said plurality of lead wires to said circuit board.

2. The indicating instrument as claimed in claim 1, wherein
    said distance is about 10 mm.

3. The indicating instrument as claimed in claim 1, further comprising at least one additional light emitting diode, wherein
    each of said light emitting diodes is disposed at the distance from said ends of said lead wires sufficient to insulate said light emitting diodes from heat of soldering said ends to said printed circuit board.

4. The indicating instrument as claimed in claim 1, wherein
    each said lead wire extends radially outward so that said end can be soldered to a portion that is located remote from said rotary shaft.

5. The indicating instrument as claimed in claim 1, wherein each of said plurality of lead wires has a beam-like portion disposed in said case member and extended along said printed circuit board and a U-shaped portion disposed in said terminal box.

6. An indicating instrument comprising:
    a dial plate having a through hole;
    a printed circuit board disposed behind said dial plate;
    a drive unit having a drive control section disposed behind said printed circuit board and a rotary shaft extending from said drive control section through said printed circuit board toward said through hole of said dial plate, said drive control section having a step motor and a plurality of lead wires soldered to said printed circuit board;
    a light conductive luminous pointer having a base portion carried by an end of said rotary shaft via said through hole to rotate along the surface of said dial plate; and
    a light emitting diode disposed on said printed circuit board near said rotary shaft so that said base portion of said pointer can receive light emitted from said light emitting diode through said through hole, said light emitting diode being soldered to said printed circuit board; wherein
    said printed circuit board has a first portion soldered to said light emitting diode and a second portion separately soldered to said plurality of lead wires disposed at a distance from said light emitting diode;
    said drive control section comprises a case member for accommodating said step motor and a terminal box for accommodating said plurality of lead wires so that said rotary shaft and said plurality of lead wires respectively extent upward from said drive unit at opposite ends of said drive unit, whereby
    each of said plurality of lead wires has an end soldered to portions of said printed circuit board at the distance from said light emitting diode sufficient to insulate said light emitting diode from heat of soldering said ends to said printed circuit board.

7. The indicating instrument as claimed in claim 6, wherein
    said distance is about 10 mm.

8. The indicating instrument as claimed in claim 6, further comprising at least one additional light emitting diode, wherein
    said dial plate comprises a transparent member; and
    each end of said plurality of lead wires is soldered to a portion of said printed circuit board at the distance sufficient to insulate said light emitting diodes from heat of soldering said ends to said printed circuit board.

9. An indicating instrument comprising:
    a dial plate having a through hole;
    a printed circuit board disposed behind said dial plate, said printed circuit board having a plurality of connectors soldered to said printed circuit board;
    a drive unit having a drive control section disposed behind said printed circuit board and a rotary shaft extending from said drive control section through said circuit board toward said through hole of said dial plate, said drive control section having a step motor with a plurality of lead wires connected to said plurality of connectors and a resinous gear train connected between said step motor and said rotary shaft;
    a light conductive luminous pointer having a base portion carried by an end of said rotary shaft to rotate along the surface of said dial plate; and
    a light emitting diode disposed on said printed circuit board near said rotary shaft so that said base portion of said pointer can receive light emitted from said light emitting diode through said through hole, said light emitting diode being soldered to said printed circuit board, wherein said printed circuit board has a first portion soldered to said light emitting diode and a second portion separately soldered to said plurality of lead wires disposed at a distance from said light emitting diode;

said drive control section comprises a case member for accommodating said step motor and a terminal box for accommodating said plurality of lead wires so that said rotary shaft and said plurality of lead wires respectively extend upward from said drive unit at opposite ends of said drive unit, whereby each end of said plurality of lead wire is disposed on said printed circuit board at the distance from said light emitting diode to insulate said diode from heat of soldering said plurality of lead wires to said circuit board.

10. The indicating instrument as claimed in claim 9, further comprising at least one additional light emitting diode.

11. The indicating instrument as claimed in claim 10, wherein each of said light emitting diodes is a surface-mounting type diode, and said printed circuit board comprises a first portion to which each of said light emitting diodes is soldered and a second portion to which said plurality of lead wires is soldered after said light emitting diodes is soldered.

* * * * *